(12) United States Patent
Kasukabe et al.

(10) Patent No.: US 7,420,380 B2
(45) Date of Patent: Sep. 2, 2008

(54) PROBE CARD AND SEMICONDUCTOR TESTING DEVICE USING PROBE SHEET OR PROBE CARD SEMICONDUCTOR DEVICE PRODUCING METHOD

(75) Inventors: Susumu Kasukabe, Yokohama (JP); Takeshi Yamamoto, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/562,797

(22) PCT Filed: Jul. 2, 2004

(86) PCT No.: PCT/JP2004/009412

§ 371 (c)(1),
(2), (4) Date: Dec. 29, 2005

(87) PCT Pub. No.: WO2005/003793

PCT Pub. Date: Jan. 13, 2005

(65) Prior Publication Data

US 2006/0192575 A1    Aug. 31, 2006

(30) Foreign Application Priority Data

Jul. 2, 2003    (JP) .............................. 2003-189949

(51) Int. Cl.
    *G01R 31/02*    (2006.01)
(52) U.S. Cl. ...................................... 324/754
(58) Field of Classification Search .......... None
    See application file for complete search history.

(56) References Cited

U.S. PATENT DOCUMENTS

| | | | | |
|---|---|---|---|---|
| 5,177,439 A | * | 1/1993 | Liu et al. ...................... | 324/754 |
| 5,399,505 A | * | 3/1995 | Dasse et al. ................... | 438/17 |
| 5,621,333 A | * | 4/1997 | Long et al. .................... | 324/762 |
| 5,665,609 A | * | 9/1997 | Mori ............................ | 438/16 |
| 5,847,571 A | * | 12/1998 | Liu et al. ...................... | 324/754 |
| 5,973,504 A | * | 10/1999 | Chong .......................... | 324/754 |
| 6,232,143 B1 | * | 5/2001 | Maddix et al. ............... | 438/100 |
| 6,379,982 B1 | * | 4/2002 | Ahn et al. ...................... | 438/14 |
| 6,426,638 B1 | * | 7/2002 | Di Stefano .................... | 324/754 |
| 6,507,204 B1 | * | 1/2003 | Kanamaru et al. ........... | 324/754 |
| 6,586,955 B2 | * | 7/2003 | Fjelstad et al. ............... | 324/754 |
| 7,219,422 B2 | * | 5/2007 | Wada et al. .................... | 29/842 |
| 7,285,968 B2 | * | 10/2007 | Eldridge et al. .............. | 324/754 |

FOREIGN PATENT DOCUMENTS

| | | |
|---|---|---|
| EP | 0999451 A2 | 5/2000 |
| JP | 07-007056 | 1/1995 |
| JP | A 7 94561 | 4/1995 |
| JP | 10-308423 | 11/1998 |
| JP | 11-023615 | 1/1999 |
| JP | 2000-150594 | 5/2000 |
| JP | A 2000-150594 | 5/2000 |
| JP | 2001-091543 | 4/2001 |
| JP | 2002-139554 | 5/2002 |
| JP | 2003-031628 | 1/2003 |

* cited by examiner

*Primary Examiner*—Ha Nguyen
*Assistant Examiner*—Richard Isla-Rodas
(74) *Attorney, Agent, or Firm*—Antonelli, Terry, Stout & Kraus, LLP.

(57) ABSTRACT

A probe card, and a probe sheet used for the method of testing (producing) a semiconductor device using the probe card, include first contact terminals in electrical contact with the electrodes of a test object formed at a narrow pitch, wires connected with and led from the first contact terminals, and second contact terminals in electrical contact with the wires. The first and second contact terminals are formed using the etching holes of a crystalline member and lined with a metal sheet.

7 Claims, 12 Drawing Sheets

FIG.14
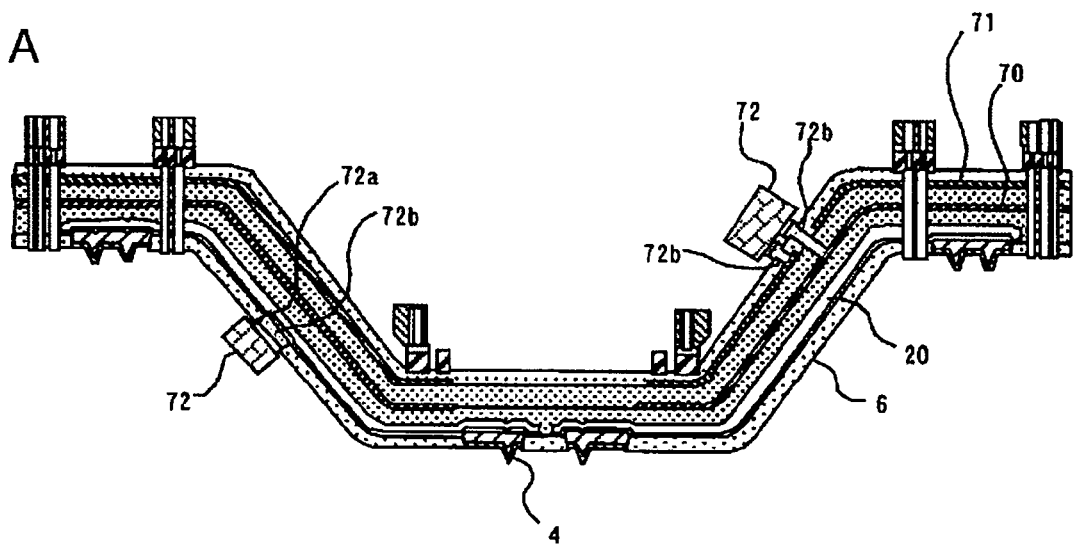
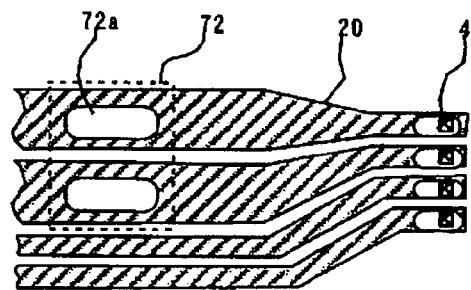

PROBE CARD AND SEMICONDUCTOR TESTING DEVICE USING PROBE SHEET OR PROBE CARD SEMICONDUCTOR DEVICE PRODUCING METHOD

TECHNICAL FIELD

This invention relates to a probe card, a semiconductor testing device using the probe sheet or the probe card and a semiconductor device producing method.

BACKGROUND ART

An example of the flow of the testing steps included in the semiconductor device producing steps executed after forming a semiconductor element circuit on a wafer is mainly shown in FIG. 12, taking a packaged product, a bare chip and a CSP providing a representative form of shipment of the semiconductor device.

The tests conduced in the semiconductor device producing process are roughly divided into three as shown in FIG. 12, including a wafer test which is conducted on a wafer formed with a semiconductor element circuit and an electrode thereon to determine the conduction and the electrical signal operation of the semiconductor elements, a burn-in test for picking out an unstable semiconductor element at a high temperature or under a high applied voltage, and a select test for the product performance before shipment of the semiconductor device.

A conventional device (semiconductor test device) used for these tests of the semiconductor device is described in U.S. Pat. No. 5,461,326. The technique described in U.S. Pat. No. 5,461,326 is implemented by a self-horizontalization thin film test probe comprising a thin film support frame, a flexible thin film fixed on the support frame, a plurality of test probe contactors arranged in the central area of the outer surface of the thin film in such a manner as to apply pressure on a contact pad of the device to be tested, a plurality of conductive traces on the thin film for connecting each probe contactor to a test circuit, and a means (including a pressure plate fixed on the inner surface of the thin film in the central area and a pivot post with a hemispherical head for applying pressure pivotally to the center of the pressure plate) for automatically rotating the central area of the thin film under the pressure applied by the probe test contactor onto the contact pad of the device to be tested.

Another conventional technique is described in U.S. Pat. No. 6,305,230. U.S. Pat. No. 6,305,230 discloses a technique implemented by a connecting device including a support member, a multilayer film having a plurality of contact terminals with a sharp tip arranged in the probing-side area thereof and a ground layer with a plurality of lead wires electrically connected and led to each contact terminal through an insulating layer, a frame fixed on the reverse side of the multilayer film, a holding member, a contact pressure application means for applying the contact pressure to the holding member from the support member to bring the tip of each contact terminal into contact with each electrode, and a compliance mechanism for projecting the tip surfaces of the contact terminals in parallel along the surface of the electrodes when the tip surfaces of the contact terminals are brought into contact with the surfaces of the electrodes, and an test system for conducting the test by electrically connecting the connecting device brought into contact with the electrodes of the test object.

DISCLOSURE OF THE INVENTION

According to U.S. Pat. No. 5,461,326, however, the peripheral portion of the thin film is fixed to apply pressure to the contact terminals with the whole thin film tightly extended. The parallel projection of the pressure plate and the test object depends on the tension of the thin film. Also, in the case where the thin film is extended from the lower surface of the wiring board, a large tensile force is exerted on the thin film, and therefore the wire is liable to break. Thus, the amount of extension of the thin film is limited.

Also, the extended state of the thin film expands the arrangement of the tip of each contact terminal and makes it difficult to secure the accuracy of the tip position. Further, the pivot post and the pressure plate lack an initial parallel projection mechanism, and therefore are liable to be tilted and come into a sided contact with the test object, thereby increasing the chance of the test object being damaged.

According to U.S. Pat. No. 6,305,230, on the other hand, both the contact pressure load control and the parallel projection are carried out by a spring probe arranged around a center pivot. It is difficult, therefore, to set a spring pressure making possible both control operations at the same time. Further, the problem is that the holding member is displaced horizontally. Also, the positional accuracy of the tip of each contact terminal is delicately varied with the expansion of the thin film, and therefore it is difficult to secure the accuracy of the tip position.

As described above, none of the techniques described in the above-mentioned US Patents is satisfactory in view of the fact that the probing corresponding to the multiple pins with a narrow pitch due to the increased density of the test object such as a semiconductor element cannot be realized with a low load and a simple assembly while securing the positional accuracy of the tip of the contact terminals without damaging the test object and the contact terminals.

Also, with the recent increased integration of the semiconductor elements, the electrode pitch has been reduced (to less than about 0.1 mm, for example) and the density thereof increased more and more. In addition, the current tendency is to conduct the operation test at a high temperature (for example, 85° C. to 150° C.) to secure the reliability more positively, and therefore demand has arisen for the test device meeting this requirement.

The object of this invention is to provide a probe card having a probe sheet and an test method and apparatus using the probe card or the probe sheet in which the accuracy of the tip position of the contact terminals is secured and semiconductor elements having an electrode structure of narrow pitches can be positively test.

In order to achieve the aforementioned object, this application discloses the invention of which representative aspects are briefly described below.

(1) A probe card comprising a plurality of contact terminals in contact with an electrode arranged on a test object, wires led from the contact terminals and a multilayer wiring board having electrodes electrically connected with the wires, wherein the electrodes of the multilayer wiring board and the wires are electrically connected to each other through peripheral electrodes.

(2) A probe card including a probe sheet having a multilayer wiring board electrically connected to a tester for testing the electrical characteristics of a test object and a plurality of contact terminals in contact with a plurality of peripheral electrodes connected to the electrodes of the multilayer wiring board and the electrodes arranged on the test object, wherein the probe sheet further includes a first metal film formed to surround the plurality of the contact terminals and a second metal film formed to surround the first metal film.

(3) A semiconductor device producing method comprising the steps of:

forming semiconductor elements by building circuits in a wafer;

testing the electrical characteristics of the semiconductor elements; and separating each semiconductor element by dicing the wafer;

wherein the step of testing the electrical characteristics of the semiconductor elements uses a probe sheet having a plurality of contact terminals in contact with the electrodes of the semiconductor elements, a first metal film formed to surround the plurality of the contact terminals and a second metal film formed to surround the first metal film; and wherein pressure is applied to the area formed with the first metal film and the area formed with the plurality of the contact terminals of the probe sheet, while testing by bringing the plurality of the contact terminals into contact with the electrodes formed on the semiconductor elements.

The other objects, features and advantages of this invention will be made apparent by the following description of the invention with reference to the accompanying drawings.

BEST MODE FOR CARRYING OUT THE INVENTION

Embodiments of the invention are described in detail below with reference to the drawings. In each drawing attached hereto for explaining the embodiments of the invention, the component elements having the same function are designated by the same reference numerals, respectively, and not described again.

In this specification, the main terms are defined as follows. Specifically, the "semiconductor device" may be in any form including a wafer formed with a circuit (FIG. 1A, for example), a semiconductor element (FIG. 1B, for example) or a subsequently formed package (QFP, BGA, CSP, etc.). FIG. 1B shows an example of the test object, in which the electrodes 3 may be arranged either along the periphery or over the whole surface. The "probe sheet" is defined as a sheet having the contact terminals in contact with the electrodes of the test object and the wires led out from the terminals. The "probe card" is defined as a structure (such as shown in FIGS. 2A, 2B) connected to the electrodes of the test object and functioning as a connector for electrically connecting a tester providing a measuring instrument and the test object.

The structure of the probe card according to the invention is explained with reference to FIGS. 2A, 2B and 3A, 3B.

FIG. 2A is a sectional view showing the essential parts of the probe card according to a first embodiment of the invention. FIG. 2B is a exploded perspective view of the essential parts. The probe card according to the first embodiment comprises a support member (upper fixing plate) 7, a spring probe 12 fixed adjustably along the height of the central portion of an intermediate plate 24 screwed to the support member 7 and including a lower forward end protrusion 12a acting as a center pivot and a spring 12b for applying pressure to the probe sheet 6 through a push piece 22 movable with the forward end of the protrusion 12a as a fulcrum, a frame 21 fixedly bonded to the reverse surface in such a manner as to surround the area formed with the plurality of the contact terminals 4 of the probe sheet 6, and an intermediate plate 24 screwed to the frame 21 and having a buffer member 23 of a silicone sheet or the like and the push piece 22 at the central portion thereof between the frame 21 and the reverse surface of the area formed with the contact terminals 4 of the probe sheet 6. This support member 7 includes parallel projection adjust screws 25 whereby the surface of the probe card having the contact terminals 4 and the corresponding electrode surface having the semiconductor elements are projected in parallel.

This probe card uses a compliance mechanism having such a structure that a substantially constant desired pressure (about 20 N for the push amount of 150 µm with almost 500 pins, for example) is applied by the spring probe 12 against the push piece 22 held finely tiltably on the protrusion 12a at the forward end of the spring probe 12 arranged at the central portion of the intermediate plate 24, with the result that a substantially constant desired pressure is applied to the area formed with a plurality of the contact terminals. The central portion of the upper surface of the push piece 22 is formed with a conical groove 22a adapted to engage the protrusion 12a.

In the probe sheet 6, as shown in FIGS. 2A, 2B, a plurality of the contact terminals 4 adapted to come into contact with the electrodes 3 of the semiconductor elements 2 are formed at the central area on the probing side of the sheet, the contact terminals 4 are surrounded in two layers by a metal film 30a and a metal film 30b in the area corresponding to the frame 21, a plurality of peripheral electrodes 5 for applying and receiving signals to and from the multilayer wiring board 50 are formed on the peripheral portion on the four sides of the probe sheet 6, a metal film 30c is formed in the area corresponding to each peripheral electrode fixing plate 9 in such a manner as to surround the peripheral electrodes 5, and a multiplicity of lead wires 20 are formed between the contact terminals 4 and the peripheral electrodes 5. Further, the frame 21 is fixedly bonded on the reverse surface of the probe sheet 6 in the area formed with the contact terminals 4, and the peripheral electrode fixing plates 9 are fixedly bonded on the reverse surface of those portions of the probe sheet 6 for applying and receiving the signals which are formed with the peripheral electrodes 5, respectively. Further, the frame 21 is screwed to the intermediate plate 24. On this intermediate plate 24, the spring probe 12 is fixed and a protrusion 12a at the lower forward end thereof is adapted to engage a conical groove 22a formed at the central portion of the upper surface of the push piece 22.

In the case where the plurality of the contact terminals 4 have a central space, the metal film 30a may be formed with a metal film 30d at the central portion thereof, as shown in FIG. 3B. Also, the assembly performance can be improved by forming a pattern of a positioning knock pin 30e and a screw insertion hole 30f in advance on the metal film 30c.

As shown in FIG. 13, for example, the whole assembly is set in position using the knock pin holes 30e for positioning the metal films 30c, the corresponding knock pin holes 50e of the multilayer wiring board 50, the knock pin holes 33e of the lower holding plate 33 and the knock pin holes 9e of the peripheral electrode fixing plates 9. In this way, the peripheral electrode fixing plate 9 is fixedly screwed to the lower holding plate 33. Next, each peripheral holding plate 32 is set in position by the knock pin 34 using the knock pin hole 9e of the peripheral electrode fixing plate 9 and the knock pin hole 32e of the peripheral holding plate 32 through the buffer member 31 on the corresponding one of the peripheral electrode fixing plates 9 fixed around the peripheral electrodes 5 on the probe sheet 6, and then fixedly screwed to the lower holding plate 33. In this way, the peripheral electrodes 5 are connected under pressure to the electrode 50a of the multilayer wiring board 50 through the buffer member 31.

Then, a circular metal film 30a and a metal film 30b are formed (in the area corresponding to the frame 21) in such a manner as to surround the contact terminals 4 of the probe sheet 6 in double layers. Thus, a structure is realized in which the positional accuracy of the contact terminals is secured by the inner metal film 30a and the copy operation is possible while tilting the portion lined with the metal film at a delicate angle to the wafer surface to be contacted, in the flexible probe sheet area free of the metal film 30 between the metal film 30b formed in the area corresponding to the frame 21 and the inner metal film 30a. Specifically, a plurality of the contact terminals 4 are surrounded by the metal film 30a so that an extraneous stress is prevented from being applied to the area formed with the contact terminals at the time of test operation, and an accurate contact is realized with the electrode to be tested. In addition, the use of the metal film 30 of a material such as the 42 alloy or invar having substantially the same coefficient of linear expansion as the silicon wafer makes it possible that the metal film 30 substantially coincides with the test object (silicon wafer) in performance while at the same time securing the positional accuracy at the tip of the contact terminals even at high temperatures.

Also, a metal film 30c is formed in the area corresponding to each peripheral electrode fixing plate 9 in such a position as to surround the peripheral electrodes 5 on the periphery of the probe sheet 6 described above. Thus, the strength of the probe sheet 6 while at the same time securing the positional accuracy of the peripheral electrodes and facilitating the assembly operation. The assembly operation is further facilitated by forming positioning holes and screw insertion holes high in both positional accuracy and shape by collectively etching the metal films 30c using a photolithographic mask.

The connecting device according to a second embodiment of the invention is explained with reference to FIGS. 3A, 3B. FIG. 3A is a sectional view showing the essential parts of the connecting device according to the second embodiment of the invention, and FIG. 3B an exploded perspective view of the particular essential parts. The connecting device according to the second embodiment is different from the connecting device according to the first embodiment in that a spring plunger 13 and a projected holding pin 14 are used in place of the spring probe 12 as a means for applying pressure to the push piece 22, that a structure is used in which an intermediate plate 24 with the spring plunger 13 fixed thereon and a support member 7 are held movable by a spring plate 15, or that in the case where the contact terminals 4 of the metal film 30a have a central space, a metal film 30d is formed in the central portion. Any of these differences can be combined, whenever required, with the structure disclosed in the first embodiment.

The compliance mechanism for applying a substantially constant desire pressure is not limited to the one included in the embodiment described above but can be variously altered.

Next, a method of producing an example of the probe sheet (structure) used with the probe card described above is explained with reference to FIGS. 4A to 4H.

FIGS. 4A to 4H show a production process, step by step, to form the probe card shown in FIGS. 2A, 2B, or especially, a process in which the truncated pyramidal tip of each contact terminal and the lead wire 20 are formed integrally with a polyimide sheet using truncated pyramidal holes formed by anisotropic etching in the silicon wafer 80 as a mold member, and a metal film is coupled to the polyimide sheet by a polyimide adhesive sheet, thereby forming a probe sheet 6 with a reinforcing plate and positioning knock pin holes formed by etching on the metal film.

First, the step shown in FIG. 4A is executed. At this step, a silicon dioxide film 81 about 0.5 μm thick is formed by thermal oxidation on both sides of the (100) surface of a silicon wafer 80 having the thickness of 0.2 to 0.6 mm, and coated with a photoresist. A pattern with the photoresist removed from the positions where the truncated pyramidal holes are to be formed is removed by photolithography, after which the silicon dioxide film 81 is etched off by a mixture solution of hydrofluoric acid and ammonium fluoride with the photoresist as a mask. Then, with the silicon dioxide film 81 as a mask, the silicon wafer 80 is anisotropically etched by a strong alkali solution (such as potassium hydroxide) thereby to form truncated pyramidal etching holes 80a surrounded by the (111) surface.

According to this embodiment, the silicon wafer 80 is used as a mold member. Nevertheless, the mold member can be formed of any crystalline material and of course modified variously without departing from this limitation. Also, the shape of each hole formed by anisotropic etching according to the embodiment is not necessarily truncated pyramid but may be variously modified as long as the contact terminals 4 can be formed to secure a stable contact resistance under a small stylus pressure. Also, the electrode to be contacted can of course be contacted by a plurality of contact terminals.

Next, the step shown in FIG. 4B is executed. At this step, the silicon dioxide film 81 used as a mask is etched off by a mixture solution of hydrofluoric acid and ammonium fluoride, and the whole surface of the silicon wafer 80 is again formed with a silicon dioxide film 82 to the thickness of about 0.5 μm by thermal oxidation in wet oxygen. The resulting surface is formed with a conductive film 83, and the surface of the conductive film 83 is formed with a polyimide film 84. Then, the polyimide film 84 located at the positions where the contact terminals 4 are to be formed is removed to the depth reaching the surface of the conductive film 83.

The conductive film 83 is formed in such a manner that a chromium film about 0.1 μm thick is formed by sputtering or vapor deposition, and the resulting surface is sputtered or deposited by evaporation with copper to form a copper film about 1 μm thick. This copper film may be plated with copper to the thickness of several μm to increase the resistance to laser machining. To remove the polyimide film 84, the laser boring or the dry etching is used by forming an aluminum mask on the surface of the polyimide film 84.

Next, the step shown in FIG. 4C is executed. The conductive film 83 exposed to the openings of the polyimide film 84 is electrically plated with a material of high hardness as a main component using the conductive film 83 as an electrode thereby to form the contact terminals 4 and the connecting electrodes 4b integrally. Plating materials of high hardness including nickel 8a, rhodium 8b and nickel 8c are plated sequentially thereby to form each contact terminal portion 8 having the contact terminal 4 and the connecting electrode portion 4b integrated with each other.

Next, a conductive film 86 is formed on each contact terminal portion 8 and the polyimide film 84, and after forming a photoresist film 87, a wiring material 88 is plated.

The conductive film described above is formed by sputtering or vapor deposition of chromium. In this way, a chromium film about 0.1 μm thick is formed and the resulting surface is formed with a copper film about 1 μm thick by sputtering or vapor deposition. Copper is used as the wiring material.

Next, the step shown in FIG. 4D is executed. At this step, the photoresist mask 87 is removed, and with the wiring material 88 as a mask, the conductive film 86 is removed by soft etching, after which an adhesive layer 89 and a metal film 30 are formed, followed by forming a photoresist mask 91 on the metal film 30.

The adhesive layer 89 is formed using a polyimide adhesive sheet or an epoxy adhesive sheet. The metal film 30 is formed of a metal sheet having a low coefficient of linear expansion such as the 42 alloy (an alloy containing 42% nickel and 58% iron having a coefficient of linear expansion of 4 ppm/°C.) or invar (an alloy containing 36% nickel and 64% iron having a coefficient of linear expansion of 1.5 ppm/°C.) substantially equal to the coefficient of linear expansion of the silicon wafer (silicon mold member) 80. This metal sheet is attached on the polyimide film 84 formed with the wiring material 88 using the adhesive layer 89. In this way, the probe sheet 6 formed has an improved strength and a larger area. Also, the displacement with temperature is prevented at the time of testing, and the positional accuracy can be secured in various environments. For this reason, the metal film 30 is formed of a material having a coefficient of linear expansion substantially equal to that of the semiconductor element to be tested to secure the positional accuracy at the time of the burn-in test.

At the bonding step described above, the silicon wafer 80 formed with the polyimide film 84 having the contact terminal portions 8 and the wiring material 88 is superposed on the adhesive layer 89 and the metal layer 30, while applying the pressure of 10 to 200 Kgf/cm$^2$, heated to higher than the glass transition point temperature (Tg) of the adhesive layer 89 and bonded in vacuum with heat under pressure.

Next, the step shown in FIG. 4E is executed. At this step, after etching the metal film 30 with the photoresist mask 91, a process ring 95 is fixed on the metal film 30 by an adhesive 96, and after bonding a protective film 97 on the process ring 95, the silicon dioxide film 82 is etched off by a mixture solution of hydrofluoric acid and ammonium fluoride with a protective film 98 having a central opening as a mask. In the case where the metal film 30 is formed of a 42 alloy or invar sheet, for example, the spray etching is conducted with a ferric chloride solution. Alternatively, the photoresist mask is formed of either a liquid resist or a film resist (dry film).

Next, the step shown in FIG. 4F is executed. At this step, the protective films 97, 98 are removed, and by mounting a protective jig 100 for silicon etching, the silicon is etched off. For example, the process ring 95 is screwed to an intermediate fixing plate 100*d*, and mounted between a fixing jig 100*a* of stainless steel and a cover 100*b* of stainless steel through an O-ring 100*c*. Then, the silicon wafer 80 providing a mold material is etched off by a strong alkali solution (such as potassium hydroxide).

Next, the step shown in FIG. 4G is executed. At this step, the protective jig 100 for silicon etching is removed, a protective film is bonded to the process ring 95 as in FIG. 4D, the silicon dioxide 82, the conductive film 83 (chromium and copper) and the nickel 8*a* are etched off, and after removing the protective film, an adhesive 96*b* is applied between the frame 21 and the metal film 30*b* and between the peripheral electrode fixing plate 9 and the metal film 30*c* of the probe sheet thereby to fix the metal film 30 in position.

The silicon dioxide film 82 is etched off by a mixture solution of hydrofluoric acid and ammonium fluoride, the chromium film by a potassium permanganate solution, and the copper film and the nickel film 8*a* by an alkalic copper etching solution.

The rhodium plating 8*b* exposed to the surface of the contact terminals as the result of this series of etching process is used by reason of the fact that solder or aluminum constituting the material of the electrode 3 is hard to attach to the rhodium plating 8*b* which is higher in hardness, harder to oxidize and has a more stable contact resistance than nickel.

Next, the polyimide film 84 and the adhesive layer 89 integrated along the outer periphery of the probe sheet frame 21 and the peripheral electrode fixing plate 9 are cut out, thereby forming a probe sheet adapted to be mounted on the probe card 105.

Next, a method of producing the probe sheet according to a second embodiment somewhat different from the above-mentioned probe sheet production process is explained with reference to FIGS. 5A to 5E.

FIGS. 5A to 5E show another production process, step by step, to form a probe sheet.

First, truncated pyramidal etching holes 80*a* are formed in a silicon wafer 80 shown in FIG. 4A, a silicon dioxide film 82 is formed on the resulting surface, a conductive film 83 is formed thereon, and a photoresist mask 85 with open connection terminal portions 8 is formed on the surface of the conductive film 83.

Next, using the photoresist mask 85 shown in FIG. 5B, the electrical plating is conducted with the conductive film 83 as a power feed layer thereby to form the contact terminals 4*a* and the connecting electrode portion 4*b* integrally with each other. Then, the photoresist mask 85 is removed. The plating materials including nickel 8*a*, rhodium 8*b* and nickel 8*c*, for example, are sequentially plated so that the contact terminal 4*a* and the connecting electrode portion 4*b* are integrally formed into each contact terminal portion 8.

Next, the step shown in FIG. 5C is executed. At this step, a polyimide film 84*b* is formed in such a manner as to cover the contact terminal portions 8 and the conductive film 83, and the portion of the polyimide film 84*b* located at positions where the wiring connection holes leading from the corresponding contact terminal portions 8 are to be formed is removed up to the surface of the contact terminal portions 8 thereby to form the conductive film 86 on the polyimide film 84*b*. After forming the photoresist mask 87, the wiring material 88 is plated.

To remove a part of the polyimide film 84*b*, the laser boring process or the dry etching process with an aluminum mask formed on the surface of the polyimide film 84*b* is used.

The conductive film described above is, for example, a chromium film about 0.1 µm thick formed by sputtering or vapor deposition, and further, the surface of the chromium is formed with a copper film about 1 µm thick by sputtering or vapor deposition. Also, the wiring material is plated with copper or copper and nickel.

Next, the step shown in FIG. 5D is executed. At this step, the photoresist mask 87 is removed and the conductive film 86 is etched off with the wiring material 88 as a mask, after which an adhesive layer 89 and a metal layer 90 are bonded. Then, the metal film 90 is etched using a photoresist mask thereby to form the desired metal film pattern.

Next, through the steps similar to those shown in FIGS. 4E to 4G, a probe sheet mounted on the probe card 105 is completed as shown in FIG. 5E.

A method of producing the probe sheet according to a third embodiment is explained with reference to FIGS. 6A to 6G.

The probe sheet producing method according to this embodiment is similar to that described in FIGS. 4A to 4H, 5A to 5H, except that a plating film for selective etching is initially formed. The selective plating film 61 is used to secure the height (the amount projected from the polyimide film) of the contact terminals. In this production steps, even in the case where the contact terminals are produced with the holes formed by anisotropic etching as a mold member, the contact terminals narrow in pitch and high in density can be maintained while making it possible to adjust the height thereof independently and freely.

An example of the production method to form the probe sheet using the selective plating film 61 is explained below with reference to FIGS. 6A to 6G.

First, the step shown in FIG. 6A is executed. At this step, like at steps shown in FIGS. 4A, 4B, pyramidal etching holes are formed in the silicon wafer 80, and the resulting surface is formed with a silicon dioxide film 82 and a conductive film 83. Unlike in FIG. 4B, however, a pattern of a photoresist 60 or a dry film is formed at the portion corresponding to each contact terminal portion 8.

Next, the step shown in FIG. 6B is executed. With the conductive film 83 as an electrode, the selective plating film 61 is plated. The selective plating film 61 of copper 10 to 50 μm thick is an example.

Next, the step shown in FIG. 6C is executed. At this step, a chromium film is formed on the surfaces of the photoresist 60 and the selective plating film (copper plated layer) 61, and the resulting surface is formed with a polyimide film 62. Then, an aluminum mask 63 is formed on the surface of the polyimide film 62. The chromium film about 0.1 μm thick is formed in order to secure the adhesion with polyimide in the process, and the chromium film may be done without.

Next, the step shown in FIG. 6D is executed. At this step, using the aluminum mask 63 formed on the surface of the polyimide film 62, the portion of the polyimide film 62 and the photoresist 60 corresponding to each contact terminal portion 8 is removed by laser or dry etching.

Next, the step shown in FIG. 6E is executed. At this step, the aluminum mask 63 is removed, and with the conductive film 83 and the selective plating film 61 as an electrode, a material high in hardness as a main component is electrically plated, so that each contact terminal 4a and the corresponding connecting electrode portion 4b are formed integrally. The plating materials high in hardness include nickel 8a, rhodium 8b and nickel 8c sequentially plated so that each contact terminal 4a and the corresponding connecting electrode portion 4b are integrated into the contact terminal portion 8.

Next, at steps similar to those shown in FIGS. 4C to 4E, the desired pattern of the lead wires 88 and the metal film 30 shown in FIG. 6F is formed.

Next, at steps similar to those shown in FIGS. 4E to 4G, the probe sheet shown in FIG. 6G is formed.

With regard to the method of producing a probe sheet according to a fourth embodiment, the production steps thereof are explained with reference to FIGS. 7A to 7E2.

This probe sheet producing method is similar to the method described in FIGS. 4A to 4H, 5A to 5E except that a plating film is initially formed for selective etching, like in FIGS. 6A to 6G, to secure the height (amount projected from the polyimide film) of the contact terminals. The difference from the steps shown in FIGS. 6A to 6G is that the photoresist 60 formed at the portion corresponding to each contact terminal portion 8 is removed and the contact terminal portion is also filled with polyimide integrally.

An example of the producing method to form the probe sheet using the selective plating film 61 is explained below with reference to FIGS. 7A to 7E2.

First, the step shown in FIG. 7A is executed. At this step, like in FIG. 6B, pyramidal etching holes are formed in the silicon wafer 80, and the resulting surface is formed with a silicon dioxide film 82 and a conductive film 83, and a pattern of a photoresist 60 or a dry film is formed at each portion corresponding to the contact terminal portion 8. Then, with the conductive film 83 as an electrode, a selective plating film 61 is formed. After that, the photoresist 60 is removed from the entire surface including the surface of the conductive film 83, and then a chromium film 64 is formed, so that a polyimide film with the polyimide 62a filled integrally in the contact terminal portions is formed. In this case, the chromium film can be done without.

Next, at steps similar to those of FIGS. 6D to 6G, the probe sheet shown in FIG. 6G is formed.

As shown in FIGS. 7C, 7D, with a metal film as a mask, the portion of the polyimide adhesive layer and the polyimide film around the contact terminal portions may be removed by laser or dry etching, and a bridge with the contact terminal portion reinforced by the metal film and the contact terminal portion supported by the wiring material or a cantilever beam as shown in FIG. 7E may be formed.

The structure including the bridge or the cantilever beam can increase the amount of absorbing the height variations of the contact surfaces of the contact terminals. Also, the structure of these twin and cantilever beams can of course be formed by other probe sheet producing methods in similar fashion.

The production steps of a probe sheet producing method according to a fifth embodiment are explained with reference to FIGS. 8A to 8D.

In this probe sheet producing method, each contact terminal portion 8 is formed using the photoresist 65, and after removing the photoresist 65 and exposing the contact terminal portions 8, a polyimide film 84b is covered. Then, a part of the polyimide film 84b is removed thereby to form the lead wires 88. Except for this point, the producing method according to this embodiment is similar to that described in FIGS. 6A to 6G.

An example of the producing method according to this embodiment is explained below with reference to FIGS. 8A to 8D.

First, the step shown in FIG. 8A is executed. At this step, like in FIGS. 6A to 6E, using the pattern of the photoresist 65 on the surface of the selective plating film 61, the contact terminal portions 8 are formed with the pyramidal etching holes formed in the silicon wafer 80 as a mold member. In place of the polyimide film 62 shown in FIG. 6C or the polyimide film 62a shown in FIG. 6B, the photoresist 65 easy to remove is preferably used.

Next, the step shown in FIG. 8B is executed. At this step, the photoresist 65 is removed and the reverse surface portions of the silicon wafer 80 corresponding to the contact terminal portion 8 are exposed and covered by the polyimide film 86b, after which the aluminum mask 63a is formed.

Next, the step shown in FIG. 8C is executed. At this step, the portion of the polyimide film 84b connected to each lead wire 88 is removed up to the surface of the corresponding contact terminal portion 8 using the aluminum mask 63a, after which at a step similar to FIG. 6F, a pattern of the lead wires, the adhesive layer 89 and the metal film 30 is formed.

Next, at steps similar to FIGS. 4E to 4G, the probe sheet shown in FIG. 8D is formed.

Several methods of producing the probe sheet are described above, and the steps of these methods can be appropriately combined as required.

In order to prevent the disturbances of the electrical signal as far as possible as a probe for high-speed electrical signal inspection, the probe sheet is produced in a structure with the surface (two or one surface) thereof or through a ground layer. For example, the surface having a metal film pattern is formed with a film of a conductive material by sputtering. The material of the sputtered film includes chromium, titanium, copper, gold, nickel or any combination thereof.

Also, the metal film 30 may be left intact and can be used as a ground layer 70 as far as possible. As shown in FIG. 9, a copper film is formed as a multilayer film between the metal film 30 and the adhesive layer 89 on the lead wire 20 and may be used as a ground layer 70. As an alternative, as shown in FIG. 10, the silicon wafer 80 is etched off immediately after the step of FIG. 4F, and when the conductive film 83 is exposed to the surface, a photoresist mask is formed thereby to form the ground layer 70 with the conductive film 83.

The method of forming the ground layer of the probe sheet described above is of course applicable with equal effect to any of the probe card producing methods shown in FIGS. 4A to 8D.

FIGS. 14A, 14B show an example of the probe sheet 6 for installing mounting parts 72 such as a capacitor and a resistor for the purpose of preventing the disturbances of the electrical signal in the neighborhood of the contact terminals and thus making possible the electrical signal test at higher speed. FIG. 14A is a sectional view showing the ground layer 70 and the power layer 71 in sheet form and sequentially stacked into a probe sheet 6 to which the mounting part 72 is connected. FIG. 14B is a plan view schematically showing the probe sheet 6 with the surface thereof connected to the mounting parts 72. In the case where the mounting parts 72 are connected to the probe sheet 6 in the state shown in FIG. 14B, for example, the wiring width of the ground wire and the power wire is increased as far as possible to reduce the wiring resistance. The ground wire and the power wire are thus arranged adjacently (as a pair wire) to each other, and the insulating layer for the portions of the parts mounted on each wire corresponding to the connecting electrodes is formed with via-forming holes 72a by the boring technique such as laser or dry etching, which holes are filled with a conductive material 72b such as solder or plating. In this way, the mounting parts 72 can be coupled to the probe sheet 6 by soldering or metal diffusion.

FIG. 15 shows an example of the pattern of the peripheral electrodes 5 of the probe sheet 6 for conduction to the electrodes 50a formed on the surface of the multilayer wiring board 50 and the pattern of the corresponding electrodes 50a of the multilayer wiring board 50.

The wiring 20 and the peripheral electrodes 5 of the probe sheet 6 are formed by projecting the contact terminals from one of the surfaces of the polyimide sheet with the thin film wiring formed by the production process shown in FIGS. 4A to 8D, for example, thereby to form the wiring 20 in polyimide. Thus, the wiring 20, covered with polyimide, is kept out of contact with the electrodes 50a formed on the surface of the multilayer wiring board 50 and not shorted. This group of the peripheral electrodes 5 of the probe sheet 6 is set in position, using the knock pins 34 described above, with the electrodes 50a connected to the inner wiring 50b of the multilayer wiring board 50 by way of the through hole vias 50d, and held by the peripheral holding plate through the buffer member 31 thereby to press the two electrodes into contact.

A plurality of the peripheral electrodes 5 of the probe sheet 6 are formed for each electrode 50a to reduce the possibility of contact failure caused by, for example, an abnormal contact surface, foreign matter or roughness thereby to secure stable contact. A plurality of contact terminals are provided for each peripheral electrode 5 in the case where the electrode size allows. Otherwise, one contact terminal for each peripheral electrode 5 may of course be formed.

In forming the probe sheet 6 through the production process shown in FIGS. 4A to 8D, the peripheral electrodes 5 can make up pyramidal or truncated pyramidal contact terminals. As compared with the conventional hemispheric plating bumps or planar electrodes in contact with each other, therefore, a stable contact characteristic value can be realized with a low contact pressure pressure and hard contact terminals. At the same time, the photolithography makes possible the connection with a high accuracy of the tip position. For this reason, the accuracy of the tip position is so high that simply by setting in position with the positioning holes, the electrodes 50a of the multilayer wiring board 50 can be easily connected with high accuracy. Especially, the peripheral electrodes 5 for connecting to the electrodes 50a of the multilayer wiring board 50 can be collectively formed on the same surface together as the contact terminals 4 for connecting the wafer electrodes, resulting in a high efficiency.

Next, a semiconductor testing device using the probe card according to the invention described above is explained with reference to FIG. 11.

FIG. 11 shows a general configuration of an testing system including the semiconductor testing device according to the invention. FIG. 11 also shows a testing device for conducting the electrical characteristic test by applying the desired load on the surface of the wafer 1. Under this condition, the load of the spring probe 12 is imposed on the whole contact terminals, and electrical testing signals are transmitted to and received from a tester (not shown) for inspecting the electrical characteristics of the semiconductor element through the contact terminals 4 in contact with the electrodes 3 of the wafer 1, the lead wires 20, the peripheral electrodes 5, the electrodes 50a of the wiring board 50, the internal wires 50b and the connection terminals 50c.

In the general configuration of the testing system, the probe card is configured as a wafer prober. This testing system includes a sample support system 160 for supporting the semiconductor wafer 1 to be inspected, a probe card 120 for supplying and receiving electrical signals in contact with the electrodes 3 of the test object (wafer) 1, a drive control system 150 for controlling the operation of the sample support system 160, a temperature control system 140 for controlling the temperature of the test object 1, and a tester 170 for testing the electrical characteristics of each semiconductor element (chip) 2. The semiconductor wafer 1 has an arrangement of a multiplicity of semiconductor elements (chips), and a plurality of electrodes 3 constituting external connection electrodes are arranged on the surface of each semiconductor element. The sample support system 160 is configured of a sample stable 162 arranged substantially horizontally with the semiconductor wafer 1 removably placed thereon, a vertical shaft 164 arranged vertically to support the sample table 162, a vertical drive unit 165 for vertically driving the vertical shaft 164, and an X-Y stage 167 for supporting the vertical drive unit 165. The X-Y stage 167 is fixed on a housing 166. The vertical drive unit 165 is configured of, for example, a stepping motor. The horizontal and vertical positioning operation of the sample table 162 is performed by combining the movement of the X-Y stage 167 in a horizontal plane and the vertical movement by the vertical drive unit 165. Also, a rotary mechanism not shown is arranged on the sample table 162, so that the sample table 162 is rotatable in the horizontal plane.

A probe system 120 is arranged above the sample table 162. As a specific example, the probe card 120 and the multilayer wiring board 50 shown in FIGS. 2A, 2B are arranged in opposed parallel relation to the sample table 162. Each contact terminal 4 is connected to the corresponding connection terminal 50c on the wiring board 50 through the lead wire 20 and the peripheral electrode 5 on the probe sheet 6 of the probe card 120 and also through the electrode 50a and the internal wire 50b of the multilayer wiring board 50 on the one hand, and to the tester 170 through a cable 171 connected to the connection terminal 50c on the other hand.

In order to prevent the displacement due to the temperature difference between the wafer heated to the desired temperature by a heater and the probe sheet formed with the contact terminals in contact with the wafer electrode for conducting the electrical signal test and to set them in position accurately within a short time, a temperature-controllable heat generator may be formed beforehand on the surface of or in the probe sheet or the probe card. The heat generator may be formed of a metal material such as Ni—Cr or a conductive resin having a high resistance directly on the probe sheet or the multilayer wiring board layer, or a sheet formed with the particular material is held in the probe sheet or attached on the probe card. Also, a liquid heated as a heat generator is supplied into a tube in a heat block in contact with the probe card.

Unlike in the conventional method in which the temperature of the probe card is determined by the heat radiation from a heated wafer and the contact at the time of probing, the probe sheet is kept at the testing temperature independently as described above. Thus, the temperature difference between the wafer and the probe sheet at the time of testing can be avoided, thereby making possible accurate probing with high positional accuracy.

The drive control system 150 is connected to the tester 170 through the cable 172. Also, the drive control system 150 sends a control signal to and controls the operation of the actuator of each drive unit of the sample support system 160. Specifically, the drive control system 150 includes an internal computer and controls the operation of the sample support system 160 in accordance with the progress information of the test operation of the tester 170 transmitted through the cable 172. Also, the drive control system 150 includes an operating unit 151 for receiving the input of various instructions on the drive control such as an instruction for manual operation.

The sample table 162 includes a heater 141 for heating each semiconductor element 2. The temperature control system 140 controls the temperature of the semiconductor wafer 1 mounted on the sample table 162, by controlling the heater 141 or the cooling jig of the sample table 162. Also, the temperature control system 140 includes an operating unit 151 to receive the input of various instructions, for example, for manual temperature control operation. The temperature-controllable heat generator arranged in a part of the probe sheet or the probe card and the heater 141 of the sample table 162 may be operatively interlocked with each other for temperature control operation.

The operation of the semiconductor testing device is explained below. First, the semiconductor wafer 1 to be inspected is set in position on the sample table 162. By controlling the drive operation of the X-Y stage 167 and the rotary mechanism, the group of the electrodes 3 formed on a plurality of semiconductor elements arranged on the semiconductor wafer 1 is set in position just under a multiplicity of contact terminals 4 juxtaposed on the probe card 120. After that, the drive control system 150 activates the vertical drive unit 165 and moves the sample table 162 upward to the state where the whole surface of the multiplicity of the electrodes (contacted members) 3 is pushed up by about 30 to 100 μm from the point where the particular surface comes into contact with the forward end of the contact terminals. In this way, an area 4a where the multiplicity of the contact terminals 4 are juxtaposed on the probe sheet 6 is expanded, and each forward end of the multiplicity of the contact terminals 4 having secured the flatness of high accuracy is projected in parallel following the surface of the group (whole) of the multiplicity of the electrodes 3 arranged on the semiconductor element by a compliance mechanism (pressure mechanism). Thus, the contact pressure is applied based on the uniform load (about 3 to 150 mN per pin) following each contacted member (electrode) 3 arranged on the semiconductor wafer 1, so that each contact terminal 4 and each electrode 3 are connected with a low resistance (0.01 Ω to 0.1 Ω).

Further, the operating current and the operation test signal are transmitted between each semiconductor element 1 formed on the semiconductor wafer 1 and the tester 170 through the cable 171, the wiring board 50 and the contact terminals 4 thereby to determine whether the operation characteristics of the semiconductor element are satisfactory or not. Further, this series of test operation is conducted for each of a plurality of the semiconductor elements formed on the semiconductor wafer 1 thereby to determine whether the operation characteristics are satisfactory or not.

Finally, a method of producing a semiconductor device including the testing steps or the testing method using the aforementioned semiconductor testing device is explained with reference to FIG. 12.

A method of producing a semiconductor device according to the invention comprises the steps of building a circuit in a wafer and forming semiconductor elements, test the electrical characteristics of a plurality of the semiconductor elements 2 collectively in wafer form by the semiconductor testing device according to the invention, dicing and separating the wafer into each semiconductor element, and sealing the semiconductor elements with resin or the like.

Another method of producing a semiconductor device according to the invention comprises the steps of building a circuit in a wafer and forming semiconductor elements, test the electrical characteristics of a plurality of the semiconductor elements 2 collectively in wafer form by the semiconductor testing device according to the invention, and dicing and separating the wafer into each semiconductor element.

Still another method of producing a semiconductor device according to the invention comprises the steps of building a circuit in a wafer and forming semiconductor elements, sealing the wafer in resin or the like, and collectively testing the electrical characteristics of a plurality of the semiconductor elements 2 formed on the sealed wafer by the semiconductor testing device according to the invention.

A further method of producing a semiconductor device according to the invention comprises the steps of building a circuit in a wafer and forming semiconductor elements, sealing the wafer in resin or the like, collectively testing the electrical characteristics of a plurality of the semiconductor elements 2 formed on the sealed wafer by the semiconductor testing device according to the invention, and dicing and separating the wafer into each semiconductor element.

At the step of testing the electrical characteristics of each semiconductor element 2 in the method of producing the semiconductor device described above, a satisfactory contact characteristic can be obtained with high positional accuracy by use of the probe card disclosed herein.

Specifically, the test is conducted using the pyramidal or truncated pyramidal contact terminals 4 plated, using as a mold member, the holes formed by anisotropic etching of a crystalline board. Thus, a stable contact characteristic can be realized with a low contact pressure, and the semiconductor element located below can be inspected without being damaged. Also, due to the structure in which a plurality of the contact terminals 4 are surrounded by the metal film 30a, the contact terminals are not subjected to an excessive stress at the time of test operation, and therefore an accurate contact with the electrodes of each semiconductor element 2 is realized. The plurality of the semiconductor elements 2 may also tested collectively.

In view of the fact that the probing marks on the electrode of the semiconductor element 2 are in the form of small dots (pyramidally or truncated pyramidally formed holes), the electrode surface maintains flat areas free of dents, thereby making it possible to meet the requirement of a plurality of tests by contact as shown in FIG. 12.

The invention achieved by the present inventor is specifically explained above based on embodiments thereof. This invention, however, is not limited to those embodiments and can of course be variously modified without departing from the scope and spirit thereof.

The representative effects of the invention disclosed in this application are briefly explained below.

(1) An testing device is provided in which the accuracy at the tip position of the contact terminals is secured and a semiconductor element having an electrode structure having narrow pitches can be positively tested.

(2) A method of producing a semiconductor device is provided in which a satisfactory connection to the electrodes is secured and the reliability is improved.

BRIEF DESCRIPTION OF THE DRAWINGS

[FIG. 14] A is a sectional view showing the essential parts of the probe card according to an embodiment of the invention, and B a plan view schematically showing, in enlarged form, the wiring of the portion of A where the parts are mounted.

Figure 1:
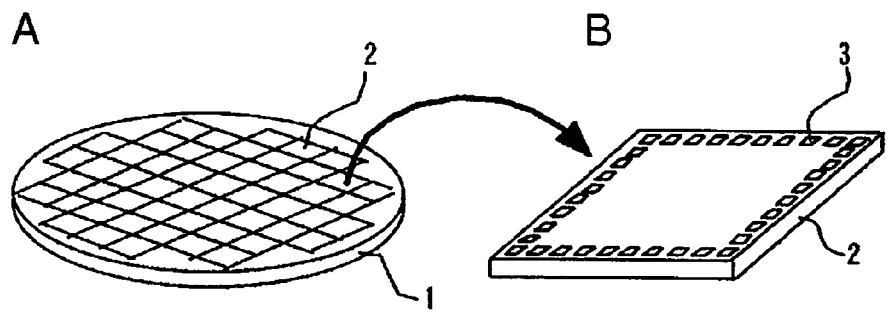
[FIG. 1] A is a perspective view showing a wafer to be contacted with an arrangement of semiconductor elements (chips), and B a perspective view showing a semiconductor element (chip) in the wafer.
Figure 5:
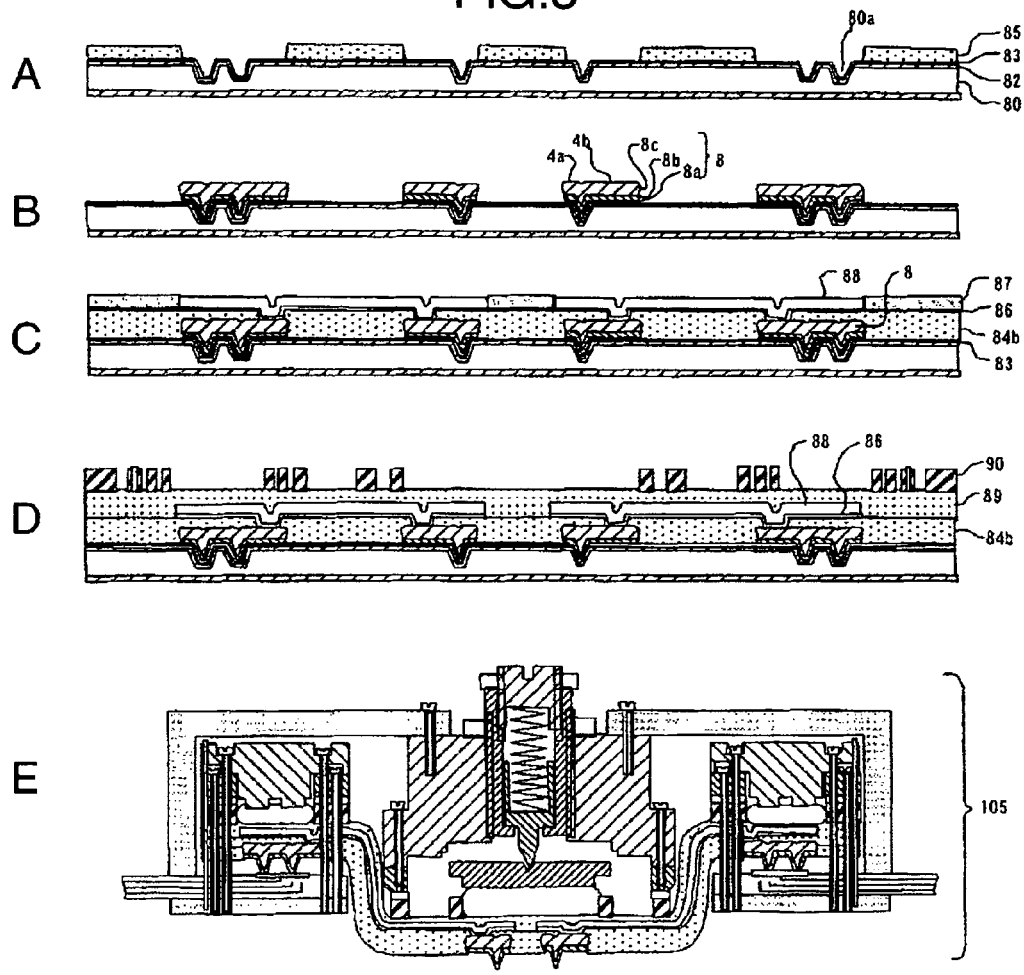
[FIG. 5] A to E show another production process, step by step, to form the probe sheet of a probe card according to the invention.
Figure 2:
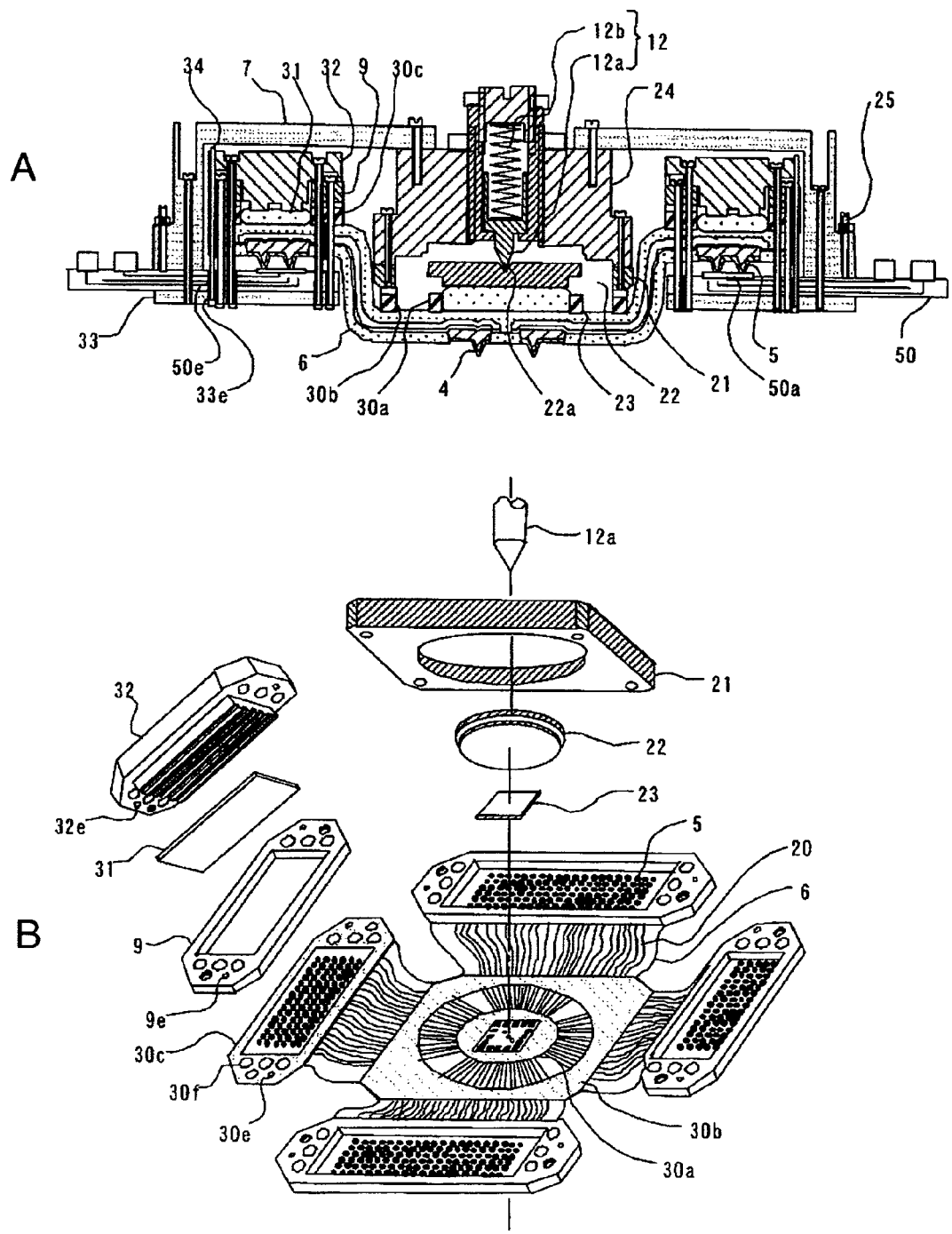
[FIG. 2] A is a sectional view showing the essential parts of the probe card according to a first embodiment of the invention, and B an exploded perspective view illustrating the essential parts in A.
Figure 3:
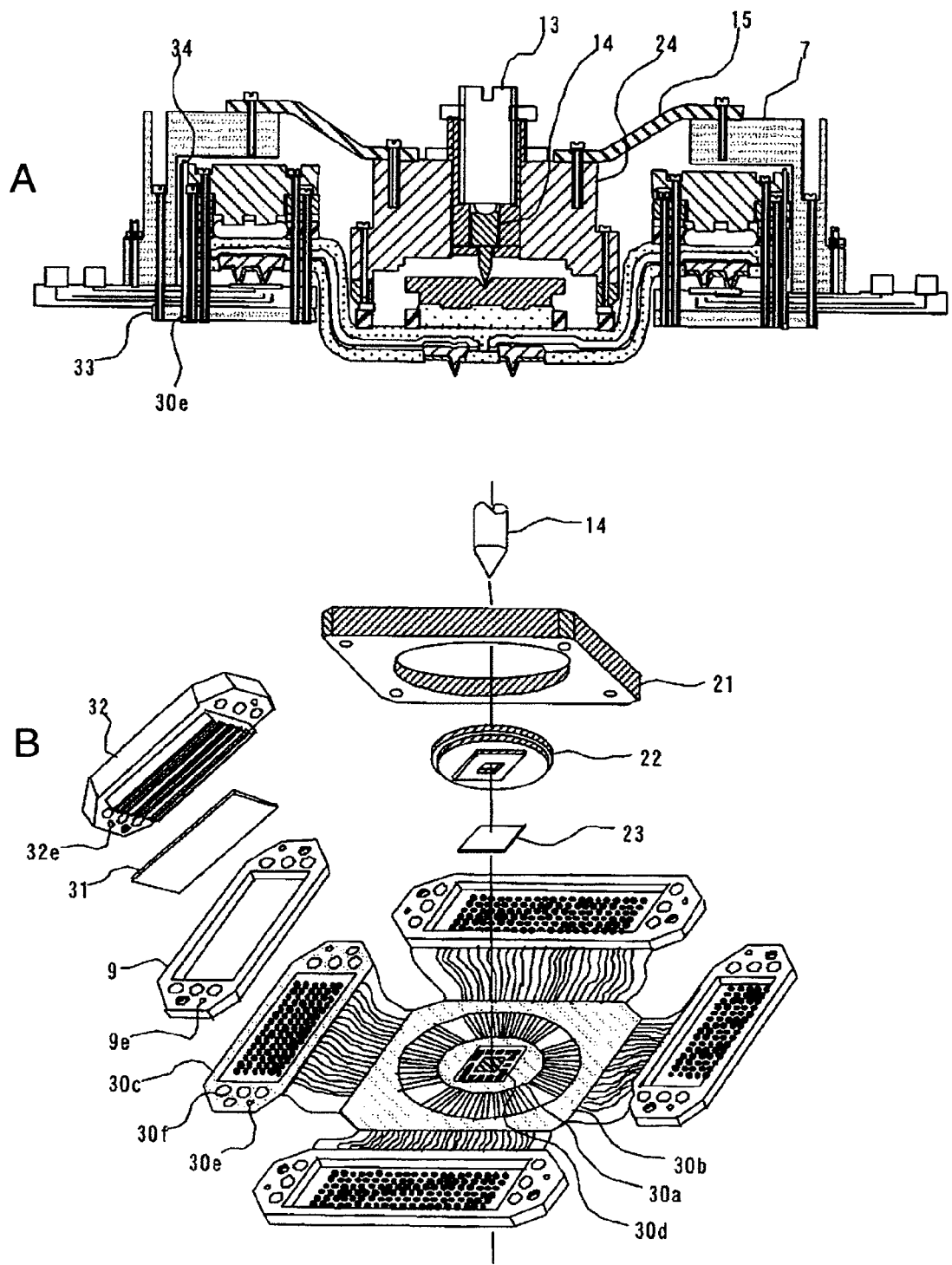
[FIG. 3] A is a sectional view showing the essential parts of the probe card according to a second embodiment of the invention, and B an exploded perspective view illustrating the essential parts in A.
Figure 4:
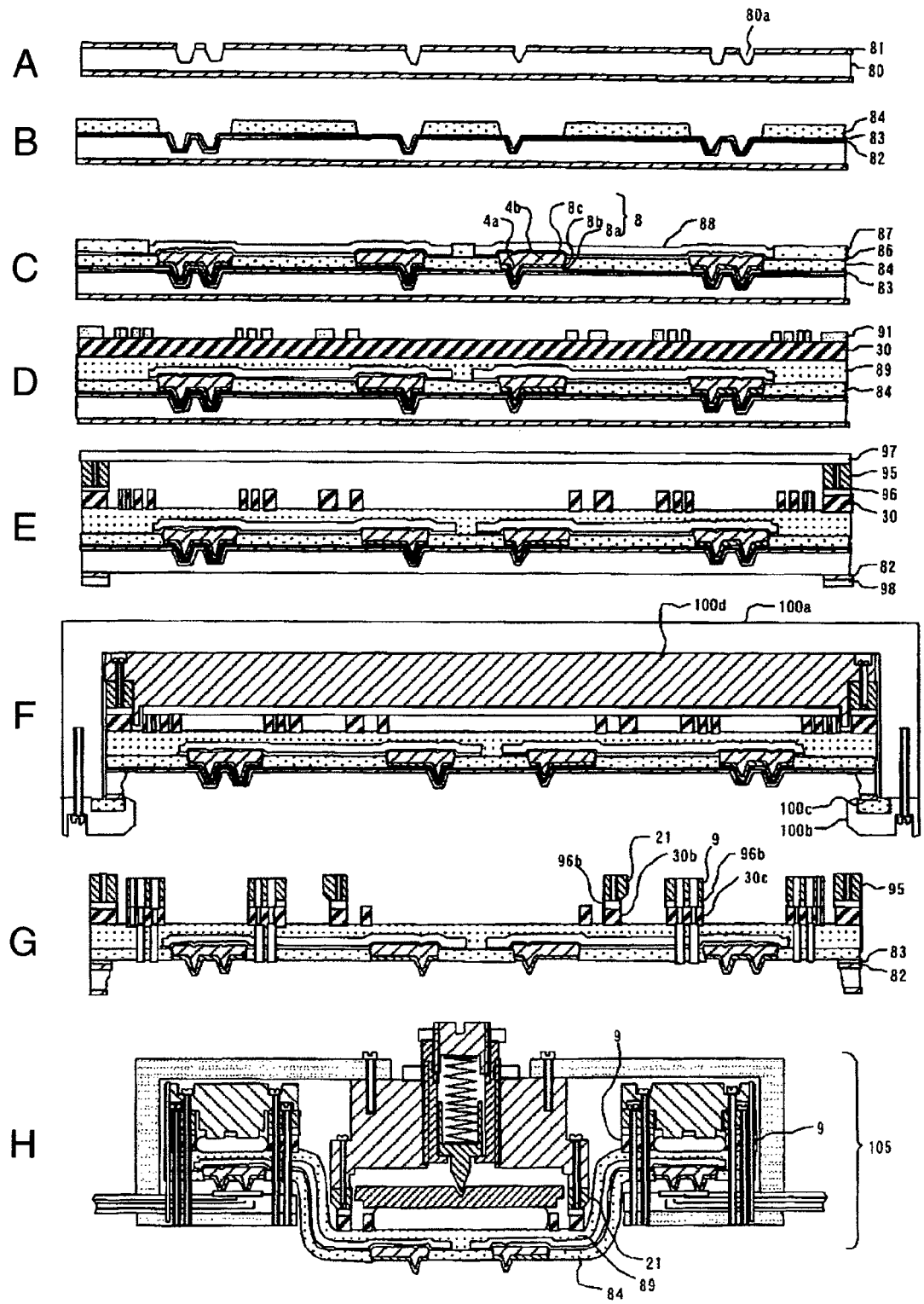
[FIG. 4] A to H show a production process, step by step, to form the probe sheet portion of a probe card according to the invention.
Figure 6:
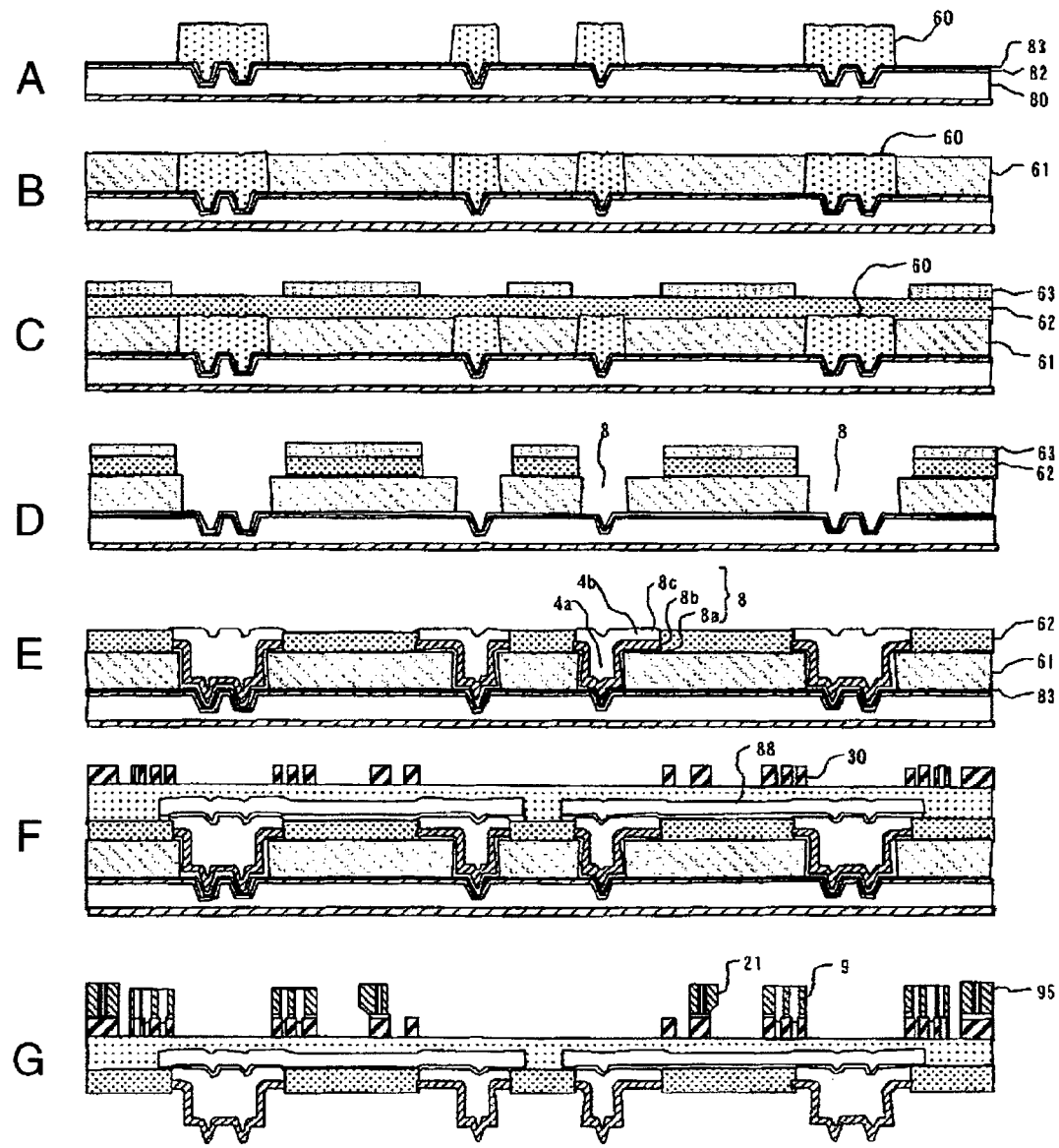
[FIG. 6] A to G show still another production process, step by step, to form the probe sheet of a probe card according to the invention.
Figure 7:
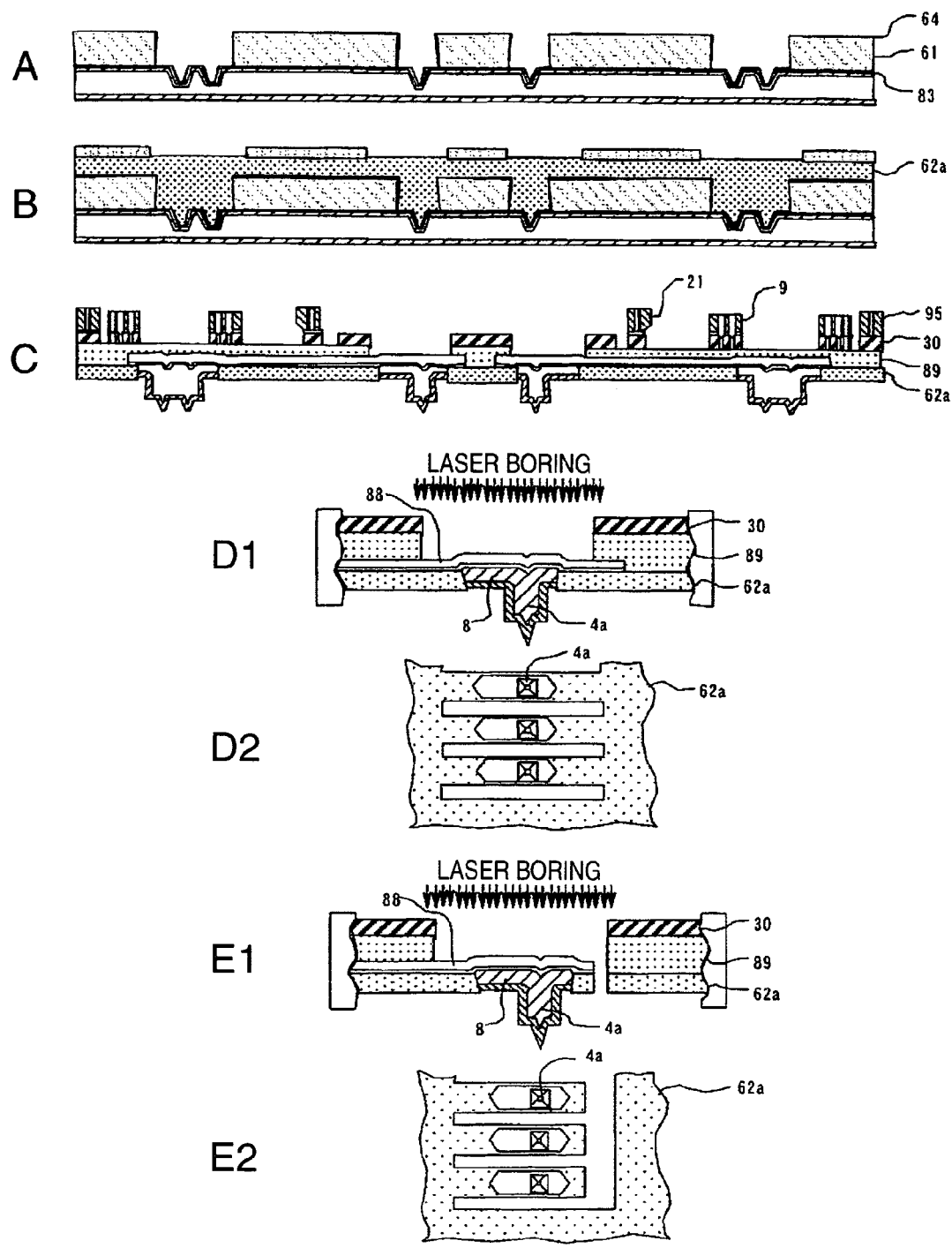
[FIG. 7] A to C show yet another production process, step by step, to form the probe sheet of a probe card according to the invention, D1 and E1 partial sectional views schematically showing the area formed with the contact terminal portion of the probe sheet of the probe card according to the invention, D2 a plan view showing a part of the area formed with the contact terminal portion in D1 as taken from the lower surface in D1, and E2 a plan view showing a part of the area formed with the contact terminal portion in E1 as taken from the lower surface in E1.
Figure 8:
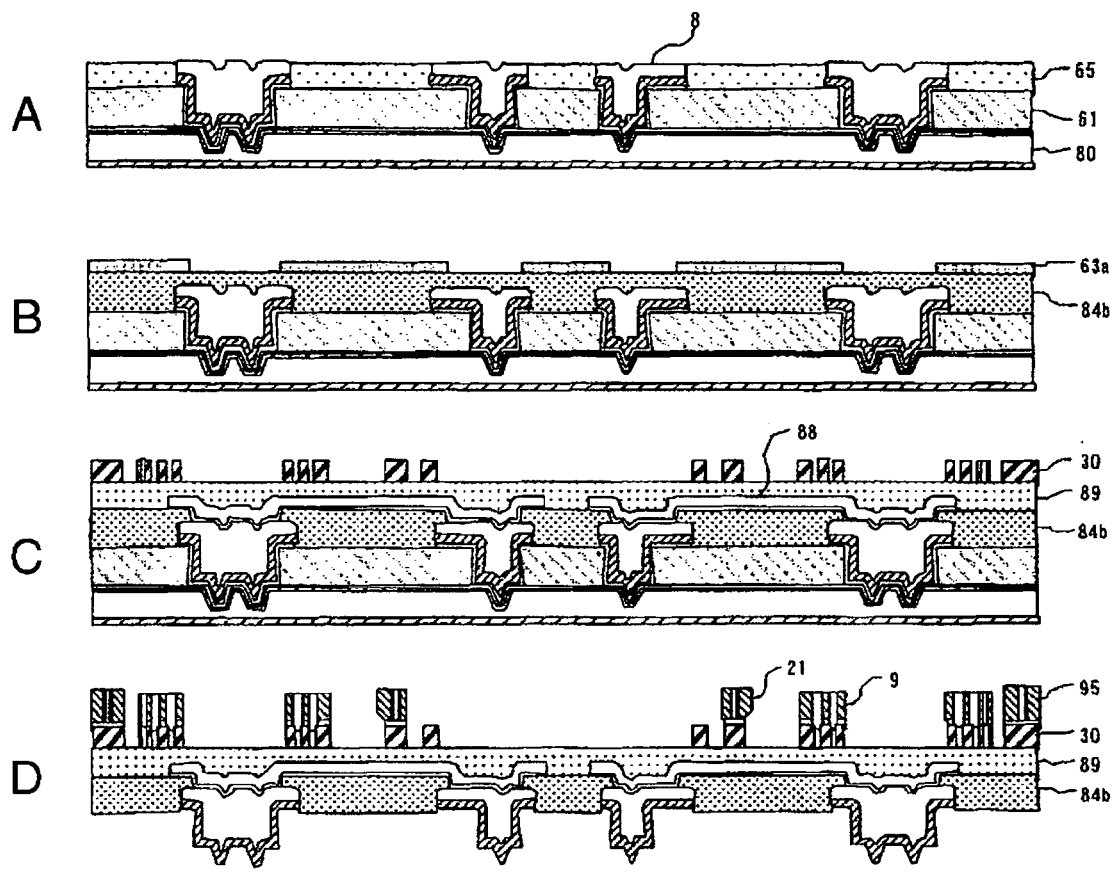
[FIG. 8] A to D show a further production process, step by step, to form the probe sheet portion of a probe card according to the invention.
Figure 9:
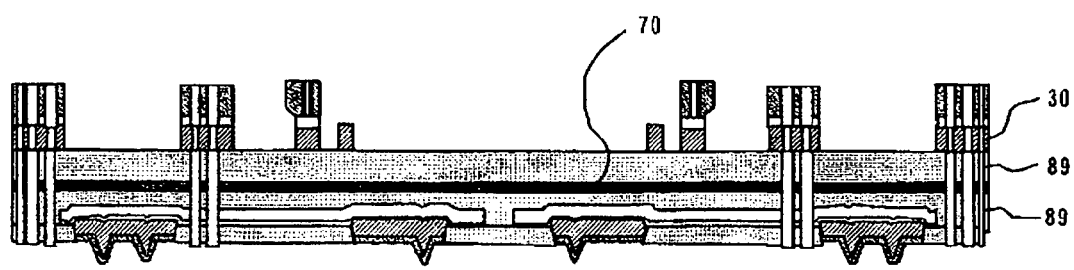
[FIG. 9] A sectional view schematically showing a probe sheet formed with a ground layer in the probe card according to the invention.
Figure 10:
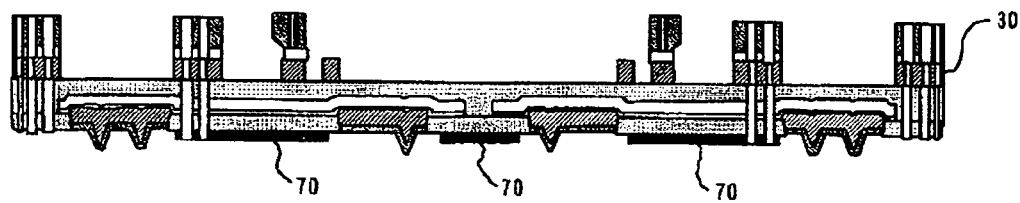
[FIG. 10] A sectional view schematically showing another probe sheet formed with a ground layer in the probe card according to the invention.
Figure 11:
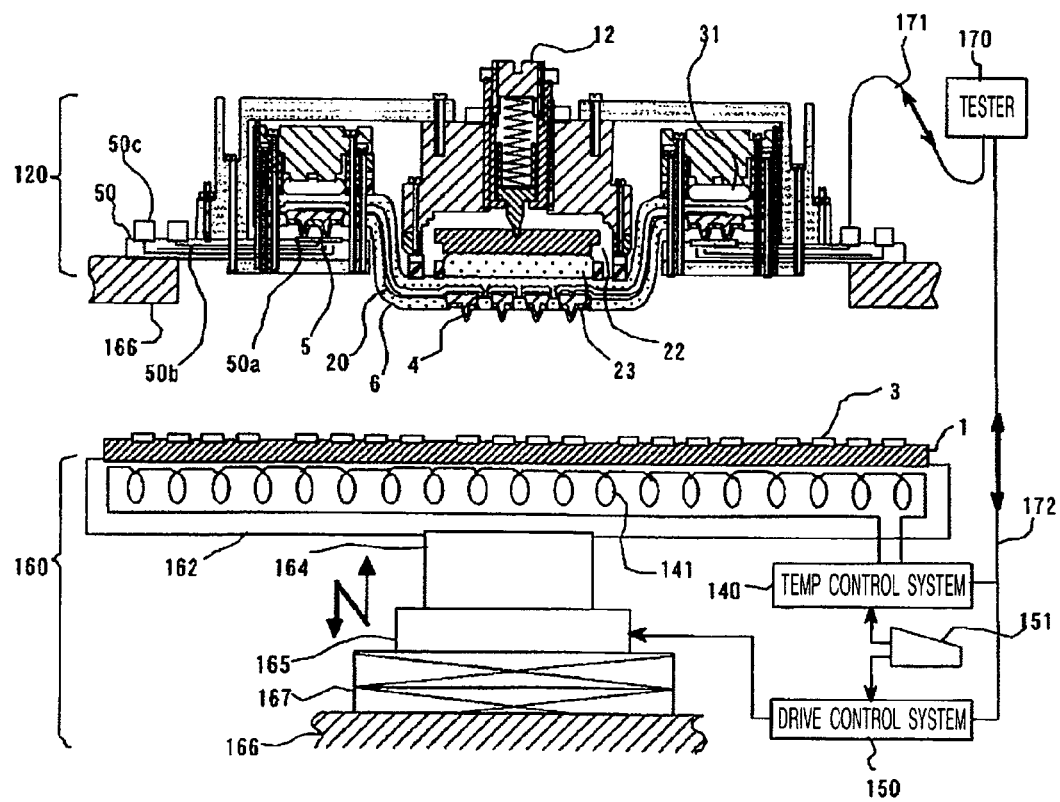
[FIG. 11] A diagram showing a general configuration of the testing system according to an embodiment of the invention.
Figure 12:
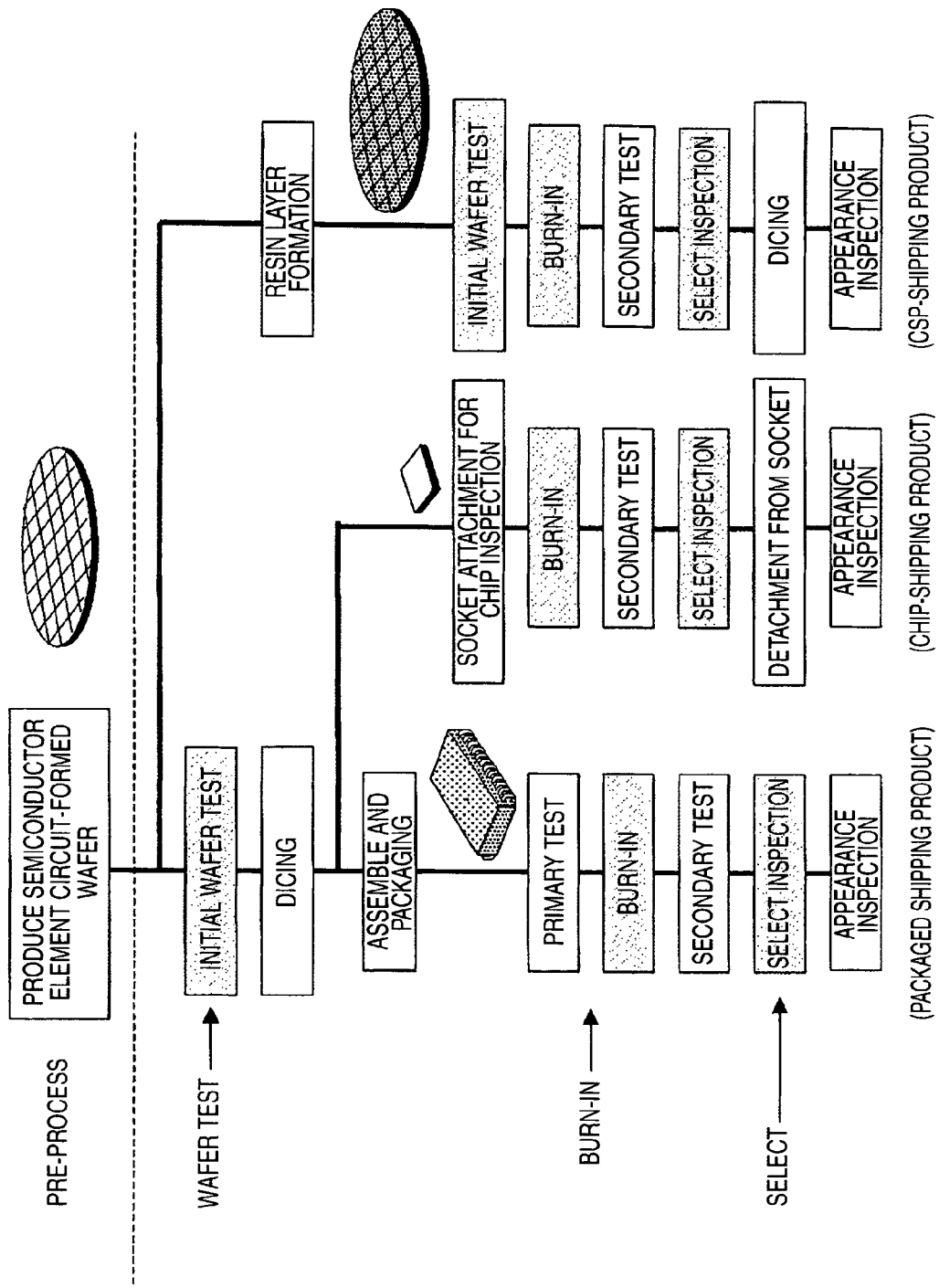
[FIG. 12] A process diagram showing the testing process of a semiconductor device according to an embodiment.
Figure 13:
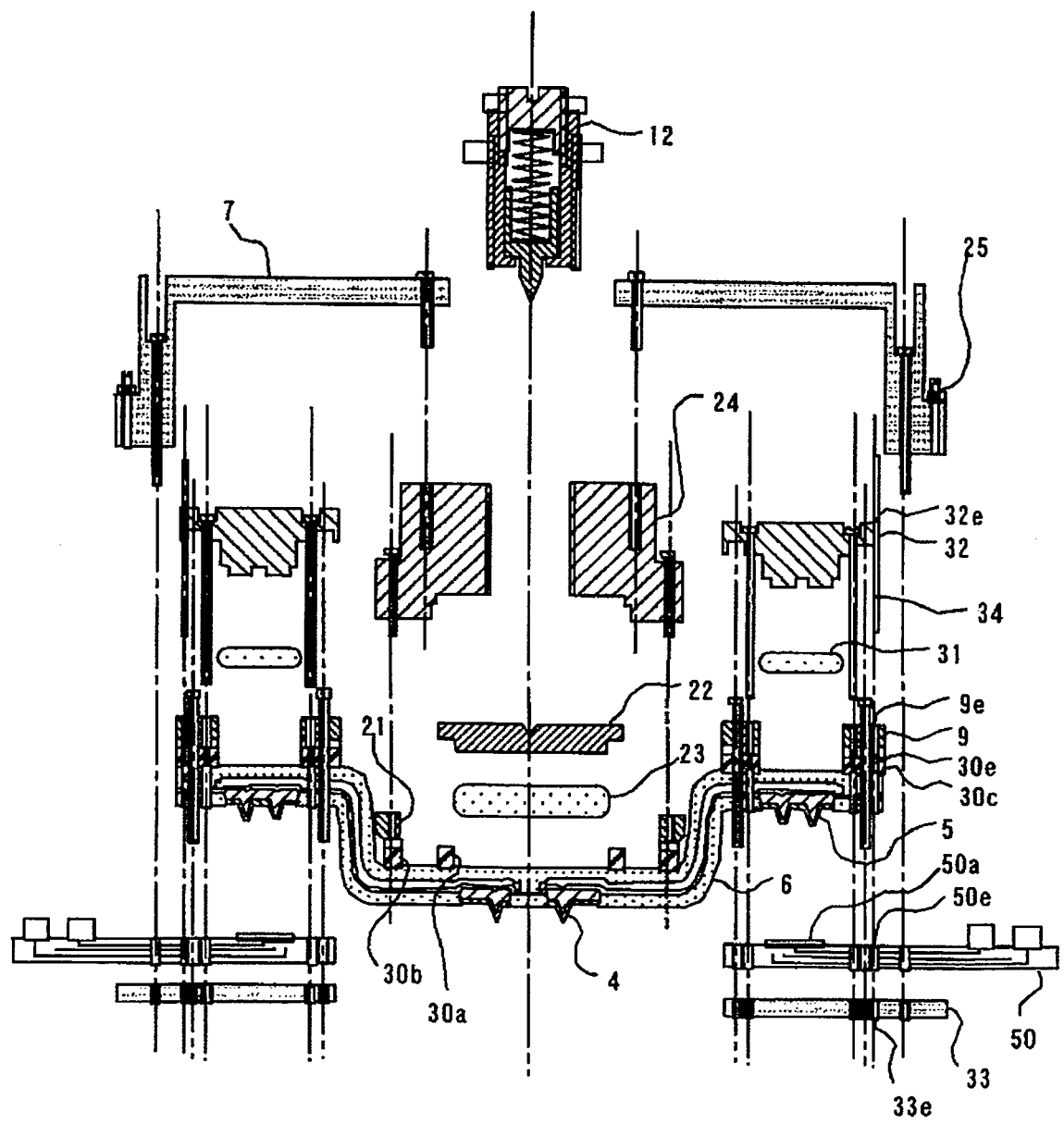
[FIG. 13] A schematic diagram showing a method of assembling the probe card according to the invention.
Figure 15:
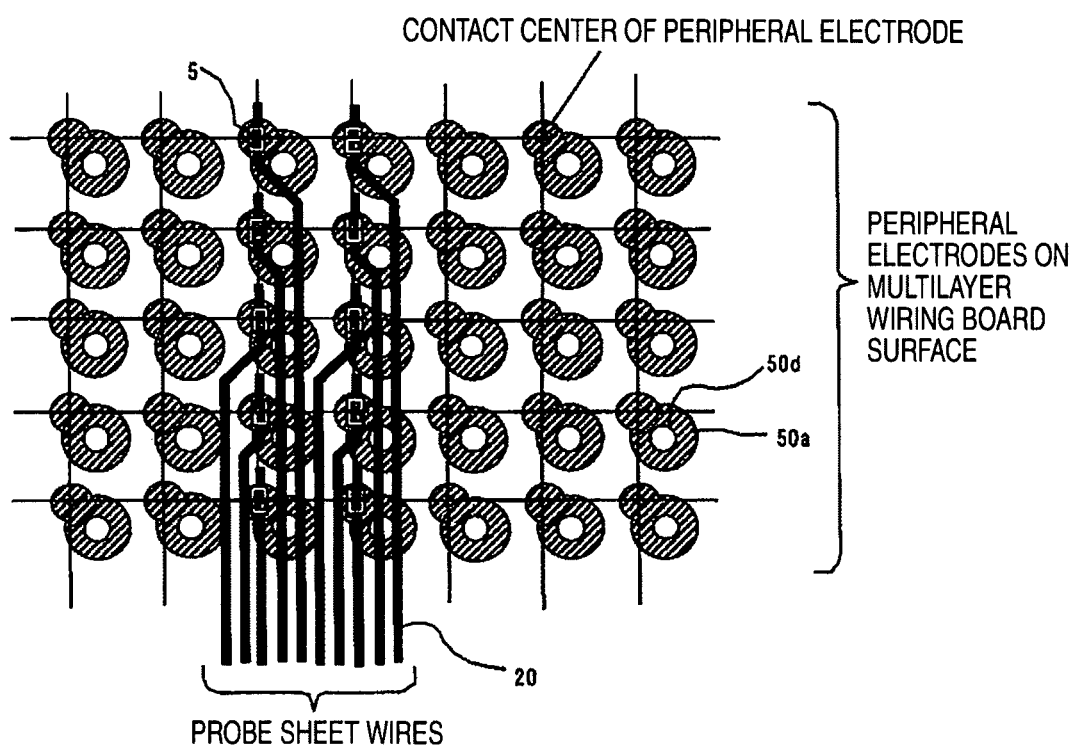
[FIG. 15] An example of the peripheral electrode pattern on the surface of a multilayer wiring board and the wiring pattern on the probe sheet according to the invention.

The invention claimed is:

1. A method of producing a semiconductor device, comprising the steps of:
building a circuit in a wafer and forming a plurality of semiconductor elements;
contacting a plurality of contact terminals formed within a first area surrounded by a first metal film of a probe sheet to each of a plurality of electrodes provided at the semiconductor elements to test electrical characteristics of each of the semiconductor elements; and
dicing and separating the wafer into the semiconductor elements;
wherein the electrical characteristics of each of the semiconductor elements are tested by pushing the first area surrounded by the first metal film while fixing a second metal film formed so as to surround the first metal film of the probe sheet thereby to make the plurality of the contact terminals contact with the electrodes of the semiconductor element to perform the testing,
wherein the first metal film has a linear expansion coefficient substantially the same as a linear expansion coefficient of the wafer, and
wherein the first metal film is formed by 42 alloy or invar.

2. A method of producing a semiconductor device according to claim 1,
wherein the plurality of the contact terminals are pyramidal or truncated pyramidal.

3. A method of producing a semiconductor device according to claim 1,
wherein the plurality of the contact terminals are formed using, as a mold member, the holes formed by anisotropic etching of a crystalline board.

4. A method of producing a semiconductor device, comprising the steps of:
building a circuit in a wafer and forming a plurality of semiconductor elements;
contacting a plurality of contact terminals formed within a first area surrounded by a first metal film of a probe card having a probe sheet to each of a plurality of electrodes provided at the semiconductor elements to test electrical characteristics of each of the semiconductor elements; and
dicing and separating the wafer into the semiconductor elements;
wherein the electrical characteristics of each of the semiconductor elements are tested by pushing the first area surrounded by the first metal film while fixing a second metal film formed so as to surround the first metal film of the probe sheet thereby to make the plurality of the contact terminals contact with the electrodes of the semiconductor element to perform the testing,
wherein the first metal film has a linear expansion coefficient substantially the same as a linear expansion coefficient of the wafer, and
wherein the first metal film is formed by 42 alloy or invar.

5. A method of producing a semiconductor device according to claim 4,
wherein the probe card further includes a means for applying pressure to an area formed with the first metal film and an area formed with the plurality of the contact terminals of the probe sheet, and wherein the electrical characteristics of each semiconductor element are tested by the pressure application means applying pressure to the area formed with the first metal film and the area formed with the plurality of the contact terminals of the probe sheet while making the plurality of the contact terminals in contact with the electrodes of the semiconductor element.

6. A method of producing a semiconductor device according to claim 4,
wherein the plurality of the contact terminals are pyramidal or truncated pyramidal.

7. A method of producing a semiconductor device according to claim 4,
wherein the plurality of the contact terminals are formed using, as a mold member, the holes formed by anisotropic etching of a crystalline board.

* * * * *